(12) United States Patent
Xie et al.

(10) Patent No.: US 10,866,477 B2
(45) Date of Patent: Dec. 15, 2020

(54) ARRAY SUBSTRATE AND DISPLAY PANEL THEREOF

(71) Applicant: SHANGHAI TIANMA MICRO-ELECTRONICS CO., LTD., Shanghai (CN)

(72) Inventors: Ming Xie, Shanghai (CN); Qiang Jia, Shanghai (CN); Mingwei Zhang, Shanghai (CN); Xiangjian Kong, Shanghai (CN); Jine Liu, Shanghai (CN); Feng Qin, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/050,022

(22) Filed: Jul. 31, 2018

(65) Prior Publication Data
US 2019/0086701 A1    Mar. 21, 2019

(30) Foreign Application Priority Data
Sep. 18, 2017 (CN) .......................... 2017 1 0839999

(51) Int. Cl.
*G02F 1/1368* (2006.01)
*H01L 27/12* (2006.01)
(Continued)

(52) U.S. Cl.
CPC ........ *G02F 1/1368* (2013.01); *G02F 1/13439* (2013.01); *G02F 1/133553* (2013.01);
(Continued)

(58) Field of Classification Search
CPC . H01L 27/3244–3279; G02F 1/136227; G02F 1/133553; G02F 2001/13356–133567
See application file for complete search history.

(56) References Cited

U.S. PATENT DOCUMENTS

2004/0233359 A1* 11/2004 Nam ................. G02F 1/133371
349/114
2007/0052885 A1    3/2007 Tanaka
(Continued)

FOREIGN PATENT DOCUMENTS

| CN | 1707338 A | 12/2005 |
|---|---|---|
| CN | 100477273 C | 4/2009 |
| CN | 103681693 A | 3/2014 |

*Primary Examiner* — Stephen M Bradley
(74) *Attorney, Agent, or Firm* — Anova Law Group PLLC

(57) ABSTRACT

An array substrate and a display panel are provided. The array substrate includes a base layer, a first metal layer, a first insulating layer, a second metal layer, a second insulating layer, a first electrode layer, and a reflective layer successively stacked along a direction perpendicular to a plane in which the base layer is located. The second metal layer is used to form a source and a drain of a thin film transistor. The first electrode layer is used to form a pixel electrode. The second insulating layer is provided with a through-hole. The pixel electrode is connected to the drain of the thin film transistor through the through-hole. The reflective layer is provided with a first through-hole, and an orthographic projection of the first through-hole onto the base layer covers an orthographic projection of the through-hole onto the base layer.

16 Claims, 5 Drawing Sheets

(51) Int. Cl.
*G02F 1/1335* (2006.01)
*G02F 1/1343* (2006.01)
*G02F 1/1362* (2006.01)

(52) U.S. Cl.
CPC .... *G02F 1/136227* (2013.01); *H01L 27/1244* (2013.01); *G02F 2201/40* (2013.01); *G02F 2203/02* (2013.01)

(56) References Cited

U.S. PATENT DOCUMENTS

2007/0058116 A1\* 3/2007 Lee .................. G02F 1/133555
 349/114
2015/0311227 A1\* 10/2015 Moriwaki ......... G02F 1/134363
 257/43

\* cited by examiner

ARRAY SUBSTRATE AND DISPLAY PANEL THEREOF

CROSS-REFERENCES TO RELATED APPLICATIONS

This application claims the priority of Chinese patent application No. 201710839999.2, filed on Sep. 18, 2017, the entirety of which is incorporated herein by reference.

FIELD OF THE DISCLOSURE

The present disclosure generally relates to the field of display technology and, more particularly, relates to an array substrate and a display panel thereof.

BACKGROUND

A display device of a thin film transistor-liquid crystal display (TFT-LCD) is gradually becoming a mainstream display device, and each one pixel on the display device is driven by a thin film transistor integrated behind the one pixel. According to different light sources, the TFT-LCD can be divided into a transmissive liquid crystal panel and a reflective liquid crystal panel.

The transmissive liquid crystal panel often uses a light-emitting diode as a backlight source. The light passes through a pixel electrode, a liquid crystal layer and a color film substrate, and is emitted to the viewer. Due to the presence of the fixed backlight source, the transmissive liquid crystal panel has a desired display performance in the dark and a degraded display performance in a bright place. In addition, the light emitted from the backlight source of the transmissive liquid crystal panel has a substantial amount of high-energy blue light, and the human eye may be easily subjected to damages when receiving the illumination of the high-energy light for a long time.

The reflective liquid crystal panel mainly uses a front-light source or an external light source as a light source, and a reflective material layer is disposed behind the liquid crystal panel. The reflected light filters out a large amount of high-energy light and causes substantially small damage to the human eye. For example, in the reflective display panel, the backlight source is not provided, and a front-light source disposed on a side of the color film substrate away from the liquid crystal molecules or an external light source is used as the light source. By disposing a reflective material, generally a reflective metal, on a surface of a side of an array substrate close to the liquid crystal molecules, the incident light generated by the front-light source or the external light source is reflected, and the reflected light pass through the liquid crystal molecules and the color film substrate, thereby entering the human eye to realize the display.

In the reflective display panel, the pixel electrode that generates an electric field is electrically connected to a drain of the thin film transistor. Therefore, a through-hole for connection has to be disposed on an insulating layer between a pixel electrode layer and the drain of the thin film transistor. However, the light reflection process at a location of the through-hole is inconsistent with the light reflection process at a location of non-through-hole, and, thus, an issue of light leakage often occurs at a location near the through-hole.

Therefore, how to provide an array substrate and a display panel capable of reducing the light leakage is an urgent issue to be solved. The disclosed array substrate and display panel are directed to solve one or more problems set forth above and other problems.

BRIEF SUMMARY OF THE DISCLOSURE

One aspect of the present disclosure includes an array substrate. The array substrate includes a base layer, and a first metal layer disposed on a side of the base layer and used to form a gate of a thin film transistor. The array substrate also includes a first insulating layer disposed on a side of the first metal layer away from the base layer, and a second metal layer disposed on a side of the first insulating layer away from the first metal layer and used to form a source and a drain of the thin film transistor. Moreover, the array substrate includes a second insulating layer disposed on a side of the second metal layer away from the first insulating layer, and a first electrode layer disposed on a side of the second insulating layer away from the second metal layer and used to form a pixel electrode. Further, the array substrate includes a reflective layer disposed on a side of the first electrode layer away from the second insulating layer and used to realize a reflective display. The second insulating layer is provided with a through-hole. The pixel electrode is connected to the drain of the thin film transistor through the through-hole. The reflective layer is provided with a first through-hole, and an orthographic projection of the first through-hole onto the base layer covers an orthographic projection of the through-hole onto the base layer.

Another aspect of the present disclosure includes a display panel comprising an array substrate. The array substrate includes a base layer, and a first metal layer disposed on a side of the base layer and used to form a gate of a thin film transistor. The array substrate also includes a first insulating layer disposed on a side of the first metal layer away from the base layer, and a second metal layer disposed on a side of the first insulating layer away from the first metal layer and used to form a source and a drain of the thin film transistor. Moreover, the array substrate includes a second insulating layer disposed on a side of the second metal layer away from the first insulating layer, and a first electrode layer disposed on a side of the second insulating layer away from the second metal layer and used to form a pixel electrode. Further, the array substrate includes a reflective layer disposed on a side of the first electrode layer away from the second insulating layer and used to realize a reflective display. The second insulating layer is provided with a through-hole. The pixel electrode is connected to the drain of the thin film transistor through the through-hole. The reflective layer is provided with a first through-hole, and an orthographic projection of the first through-hole onto the base layer covers an orthographic projection of the through-hole onto the base layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

It should be noted that, once an item is defined in one Figure, similar reference numbers and letters represent similar items in the other Figures might not need to be further discussed in subsequent descriptions.

Figure 1:
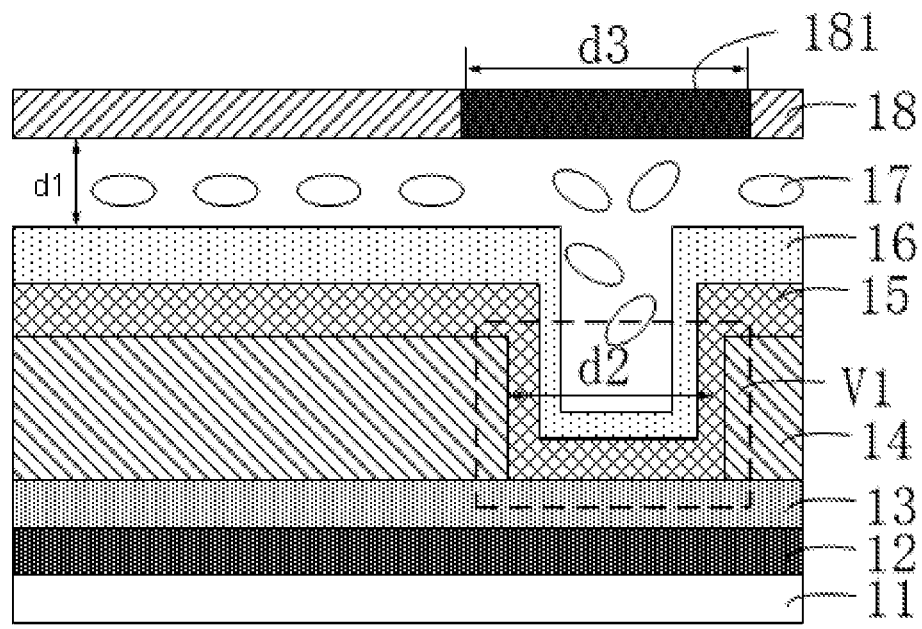
FIG. 1 illustrates a schematic diagram of film layers of an existing reflective display panel.

FIG. 1 illustrates a schematic diagram of film layers of an existing reflective display panel. Referring to FIG. 1, the existing reflective display panel includes an array substrate, a color film substrate 18, and liquid crystal molecules 17 between the array substrate and the color film substrate 18. The array substrate includes a gate metal layer 11, a gate insulating layer 12, a source and drain metal layer 13, an interlayer insulating layer 14, a pixel electrode layer 15, and a reflective layer 16. The interlayer insulating layer 14 has a through-hole V1, and a pixel electrode on the pixel electrode layer 15 is electrically connected to a drain in the source and drain metal layer 13 through the through-hole V1. The light is incident from a side of the color film substrate 18 away from the liquid crystal molecules 17, reflected by the reflective layer 16, and then emitted out through the color film substrate 18.

For the existing reflective display panel, the issue of light leakage often occurs at the location of the through-hole V1. The light leakage issue is related to a change of the distance between the color film substrate 18 and the reflective layer 16 at the location of the through-hole V1. For example, to realize the reflective display, a certain delay amount has to be formed in a reflection region. The delay amount is determined together by a distance d1 between the color film substrate 18 and the reflective layer 16 and an effective refractive index. Because the distance d1 at the location of the through-hole V1 changes, the phase difference between the incident light and the reflected light is changed and the liquid crystal molecules 17 are disorderly arranged at the location of the through-hole V1. Accordingly, the pixel electrode cannot accurately control the display performance at the location of the through-hole V1, which easily causes the light leakage of the display screen. In particular, the light leakage is severe when displaying a black screen. The severe light leakage at the location of the through-hole V1 affects the reflection contrast and the display performance.

To solve the light leakage issue, the light leakage location is blocked in a conventional design. For example, a black matrix 181 for blocking may be disposed at the location of the color film substrate 18 facing the through-hole V1, which may reduce the light leakage. However, because the alignment between the array substrate and the color film substrate 18 has a mass production deviation of approximately ±4 micrometers, when the black matrix 181 is used for blocking, a length d3 of the black matrix 181 has to be 8 micrometers larger than a width d2 of the through-hole V1 to ensure the blocking performance. Accordingly, the conventional method will reduce the areas of effective reflection region and the display region, and affect the display performance.

The present disclosure provides a reflective display panel and an array substrate capable of reducing the light leakage. In the disclosed array substrate and display panel, to solve the light leakage issue, a reflective metal at the location of a through-hole may be hollowed out, which may not affect areas of a reflection region and a display region, and may improve the display performance of the reflective display panel while solving the light leakage issue.

Figure 2:
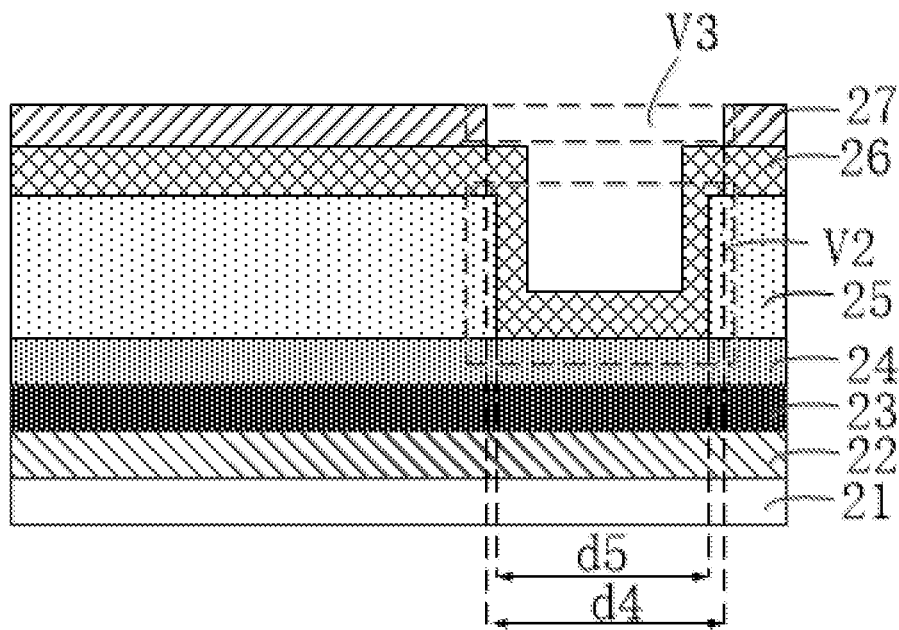
FIG. 2 illustrates a schematic diagram of film layers of an exemplary array substrate consistent with disclosed embodiments of the present disclosure.

FIG. 2 illustrates a schematic diagram of film layers of an exemplary array substrate consistent with disclosed embodiments of the present disclosure. Referring to FIG. 2, the array substrate may include a base layer 21, a first metal layer 22, a first insulating layer 23, a second metal layer 24, a second insulating layer 25, a first electrode layer 26, and a reflective layer 27.

The base layer 21 may often be a glass substrate. The first metal layer 22 may be disposed on a side of the base layer 21. In other words, the first metal layer 22 may be laid on the glass substrate, and a gate of a thin film transistor and a pattern of a scan line may be formed on the first metal layer 22 by etching.

In one embodiment, a storage electrode may be simultaneously disposed on the first metal layer 22, and, thus, a pattern of the storage electrode may have to be formed on the first metal layer 22 by etching. In another embodiment, the storage electrode may not be disposed on the first metal layer, and may be determined according to various applications, which is not limited by the present disclosure. In addition, in another embodiment, to increase the adhesion of the first metal layer 22 on the glass substrate, a buffer layer may be first prepared on the glass substrate, and then the first metal layer 22 may be disposed on the buffer layer.

The first insulating layer 23 may be disposed on a side of the first metal layer 22 away from the base layer 21. The first insulating layer 23 may be used to prevent a short circuit between the first metal layer 22 and the second metal layer 24. The first insulating layer 23 may be made of a transparent material, e.g., $SiN_x$, or $SiO_x$, etc.

The second metal layer 24 may be disposed on a side of the first insulating layer 23 away from the first metal layer 22. The second metal layer 24 may be used to form source and drain of the thin film transistor and a data line.

The second insulating layer 25 may be disposed on a side of the second metal layer 24 away from the first insulating layer 23. The first electrode layer 26 may be disposed on a side of the second insulating layer 25 away from the second metal layer 24. The first electrode layer 26 may be used to form a pixel electrode. The gate of the thin film transistor may be connected to a scan driving circuit through the scan line, the source of the thin film transistor may be connected to a pixel driving circuit through the data line, and the drain of the thin film transistor may be connected to the pixel electrode. In one embodiment, a through-hole V2 may be disposed on the second insulating layer 25, such that the drain of the thin film transistor may be connected to the pixel electrode through the through-hole V2.

A common electrode may be disposed on a side of the color film substrate. When the scan driving circuit controls turn-on of a channel between the source and the drain of the thin film transistor through the scan line, the pixel driving circuit may transmit a driving voltage signal to the drain of the thin film transistor through the data line, and then to the pixel electrode. Accordingly, an electric field capable of deflecting liquid crystal molecules may be formed between the pixel electrode and the common electrode. At the same time, the pixel electrode and the storage electrode may form a storage capacitor. When a scan signal is transmitted to the gate of the thin film transistor, the storage capacitor may be charged. Before a following scan signal is transmitted to the gate of the thin film transistor, the storage capacitor may be in a discharged state, such that a continuous electric field capable of deflecting the liquid crystal molecules may be formed between the pixel electrode and the common electrode.

The reflective layer 27 may be disposed on a side of the first electrode layer 26 away from the second insulating layer 25. The reflective layer 27 may be used to realize a reflective display. In one embodiment, the reflective layer 27 may be made of a metal material. The reflective layer 27 may be provided with a first through-hole V3. An orthographic projection d4 of the first through-hole V3 onto the base layer 21 may cover an orthographic projection d5 of the through-hole V2 onto the base layer 21. In other words, d4 may not be smaller than d5. In certain embodiments, d4 may be equal to d5. In other words, the orthographic projection of the first through-hole V3 onto the base layer 21 may overlap with the orthographic projection of the through-hole V2 onto the base layer 21.

In the reflective display panel, a light source may be located on a side of the reflective layer 27 away from the first electrode layer 26. When the light is irradiated onto the array substrate illustrated in FIG. 2, because the reflective layer 27 is provided with the first through-hole V3, and the orthographic projection of the first through-hole V3 onto the base layer 21 covers the orthographic projection of the through-hole V2 onto the base layer 21, with respect to the prior art shown in FIG. 1, the light cannot be reflected at the location of the first through-hole V3 when being irradiated onto the reflective layer 27. Accordingly, even if the liquid crystal molecules at the location of the through-hole V2 are disorderly arranged, the light leakage issue may not occur.

Compared with the technique of blocking the through-hole by the black matrix, the display area may not be reduced. Therefore, in the disclosed array substrate, the black matrix for blocking the through-hole V2 may be eliminated, and the display area may be prevented from being reduced while significantly reducing the light leakage, improving the display contrast and the display performance.

Figure 3:
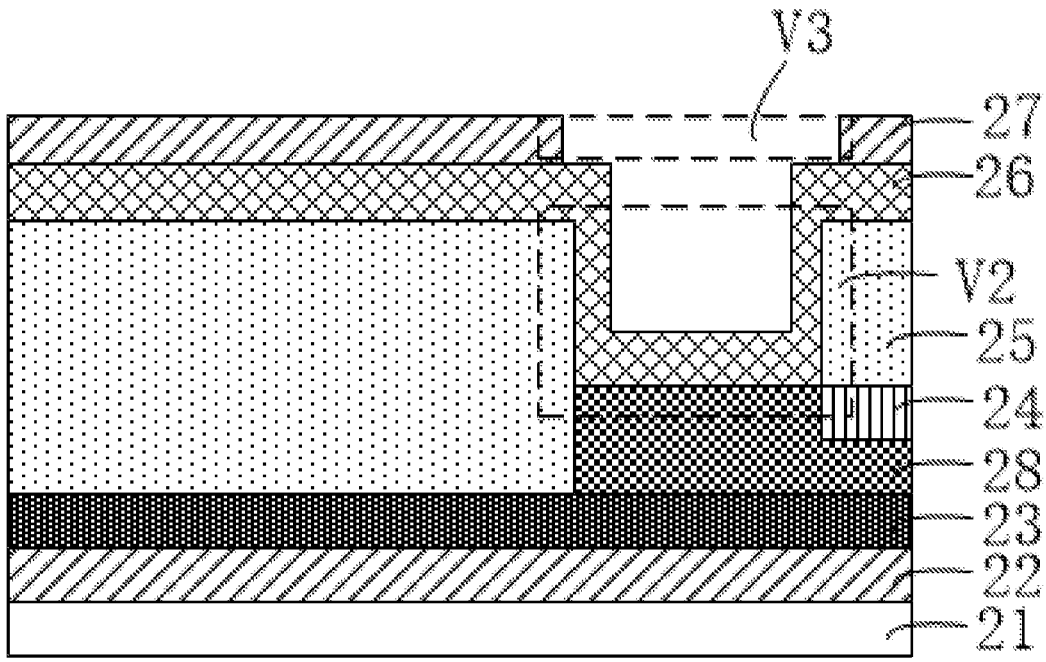
FIG. 3 illustrates a schematic diagram of film layers of another exemplary array substrate consistent with disclosed embodiments of the present disclosure.

FIG. 3 illustrates a schematic diagram of film layers of another exemplary array substrate consistent with disclosed embodiments of the present disclosure. In certain embodiments, referring to FIG. 3, the array substrate may further include a second electrode layer 28. The second electrode layer 28 may be disposed between the first electrode layer 26 and the first insulating layer 23. The second electrode layer 28 illustrated in FIG. 3 may be disposed between the second metal layer 24 and the second insulating layer 25.

An orthographic projection of the second electrode layer 28 onto the base layer 21 may partially cover the orthogonal projection of the through-hole V2 onto the base layer 21 and the orthogonal projection of the drain of the thin film transistor onto the base layer 21, respectively. In other words, the pixel electrode may be connected to the drain of the thin film transistor through the through-hole V2 and the second electrode layer. The orthographic projection of the second metal layer 24 onto the base layer 21 may not overlap with the orthographic projection of the through-hole V2 onto the base layer 21.

When the light is irradiated onto the array substrate provided by the present disclosure as illustrated in FIG. 3 from the side of the reflective layer 27 away from the first electrode layer 26, because the reflective layer 27 is provided with the first through-hole V3, the light may not be reflected by the reflective layer 27 at the location of the through-hole V2. The first electrode layer 26 and the second electrode layer 28 each may be a transparent conductive film, and the transparent conductive film has a substantially low reflectivity and does not generate strong reflection. When the light is irradiated onto the first electrode layer 26 and irradiated onto the second electrode layer 28 after passing through the first electrode layer 26, because the orthographic projection of the second metal layer 24 onto the base layer 21 does not overlap with the orthographic projection of the through-hole V2 onto the base layer 21, most of the incident light cannot be directly irradiated onto the second metal layer 24. Accordingly, in the reflective display panel using the array substrate illustrated in FIG. 3, the light cannot be reflected by the reflective layer 27 having a strong reflection performance at the location of the through-hole V2, and may be hardly irradiated onto the second metal layer 24, which may further reduce the possibility of the occurrence of the light leakage and improve the display contrast.

Figure 4:
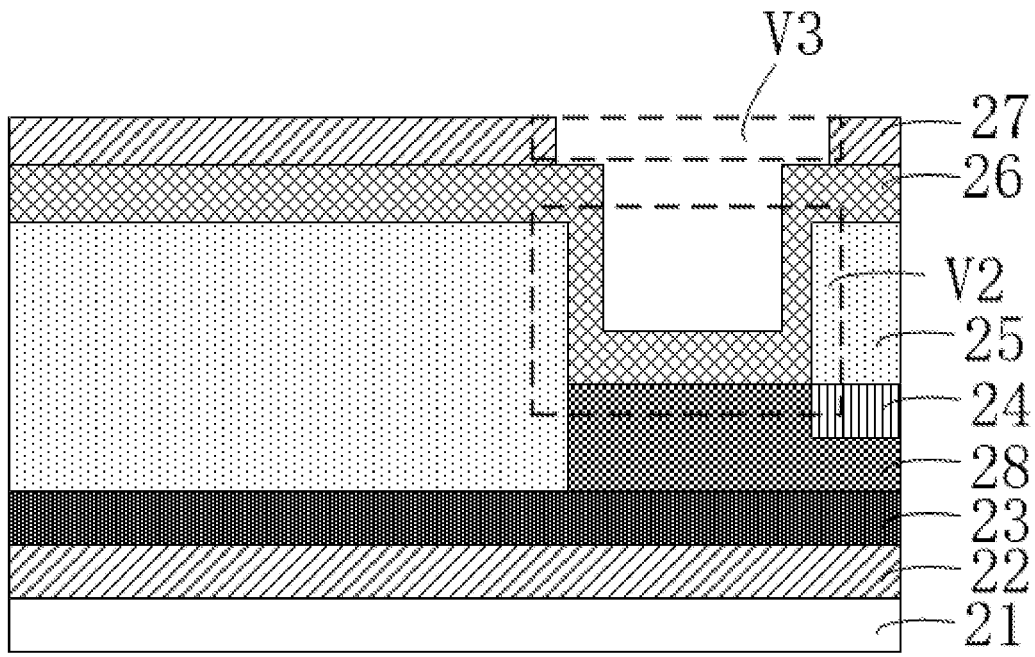
FIG. 4 illustrates a schematic diagram of film layers of another exemplary array substrate consistent with disclosed embodiments of the present disclosure.

FIG. 4 illustrates a schematic diagram of film layers of another exemplary array substrate consistent with disclosed embodiments of the present disclosure. Further, in certain embodiments, referring to FIG. 4, the orthographic projection of the second electrode layer 28 onto the base layer 21 may partially cover the orthographic projection of the through-hole V2 onto the base layer 21 and the orthographic projection of the drain of the thin film transistor onto the base layer 21, respectively. The orthographic projection of the second metal layer 24 onto the base layer 21 may not overlap with the orthographic projection of the through-hole V2 onto the base layer 21. The second electrode layer 28 may be disposed between the first insulating layer 23 and the second metal layer 24. The first electrode layer 26 and the second electrode layer 28 each may be a transparent conductive film. Therefore, the drain of the thin film transistor disposed on the second metal layer 24 may be connected to the pixel electrode through the second electrode layer 28.

The first electrode layer 26 and the second electrode layer 28 each may have a substantially low reflectivity, and may not strongly reflect the light. Thus, after the light is irradiated onto the first electrode layer 26, most of the light may pass through the first electrode layer 26, and may be irradiated onto the second electrode layer 28. Then, the light may be reflected and refracted multiple times at the interfaces between respective layers inside the array substrate. A portion of the light may be absorbed by the array substrate, and the remaining portion of the light may be emitted out in a form of diffusion reflection without forming a strong reflection at a local location, thereby reducing the light leakage and improving the display contrast and display performance.

Further, in certain embodiments, when the storage electrode is disposed on the first metal layer, an orthographic projection of the storage electrode onto the base layer may cover the orthographic projection of the through-hole onto the base layer. In other words, when the light is irradiated onto the first metal layer, the first metal layer at the location of the through-hole may also generate the reflected light.

Figure 5:
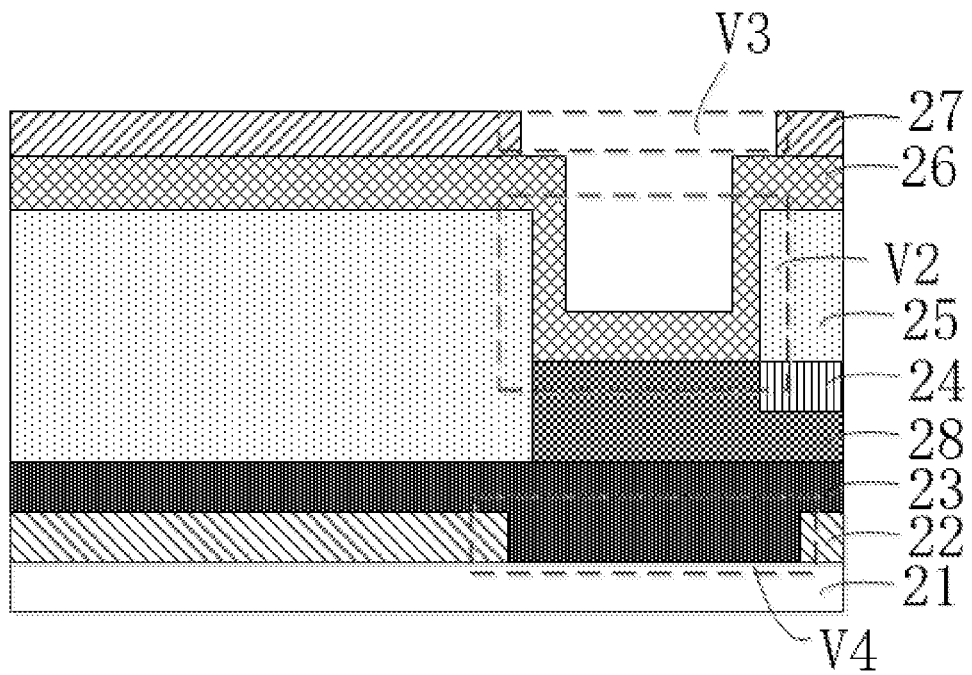
FIG. 5 illustrates a schematic diagram of film layers of another exemplary array substrate consistent with disclosed embodiments of the present disclosure.

FIG. 5 illustrates a schematic diagram of film layers of another exemplary array substrate consistent with disclosed embodiments of the present disclosure. Referring to FIG. 5, the first metal layer 22 may be provided with a second through-hole V4. An orthographic projection of the second through-hole V4 onto the base layer 21 may cover the orthographic projection of the through-hole V2 onto the base layer 21. When the light is irradiated onto the array substrate provided by the present disclosure from the side of the reflective layer 27 away from the first electrode layer 26, the light may be irradiated onto the first electrode layer 26 through the first through-hole V3 on the reflective layer 27. Because the first electrode layer 26 and the second electrode layer 28 are made of a transparent conductive material, and the first insulating layer 23 is made of a transparent insulating material, the light may be weakly reflected after being irradiated onto first electrode layer 26, and then may pass through the first electrode layer 26 and the second electrode layer 28. Because the orthographic projection of the second through-hole V4 onto the base layer 21 covers the orthographic projection of the through-hole V2 onto the base layer 21, most of the light may be hardly directly irradiated onto the first metal layer 22, while may be directly irradiated onto the base layer 21.

Even if a small amount of the light is irradiated onto the first metal layer 22 having a strong reflection effect, because the light has to pass through multilayer medium, the intensity of the light may be reduced, and a portion of the reflected light cannot be emitted out through the through-hole V2. Accordingly, a substantially small amount of the light may be reflected by the first metal layer 22 and emitted out through the through-hole V2. The intensity of the emitted light may be substantially small, and the emitted light may be absorbed and reflected by the liquid crystal molecules and the color film substrate, which may avoid the light leakage. Therefore, in the reflective display panel using the array substrate provided by the present disclosure, the occurrence of the light leakage phenomenon at the location of the through-hole V2 may be effectively reduced without using the black matrix for blocking the through-hole V2, the display performance may be improved, and the display area may increase, which may provide a desired user experience.

Figure 6:
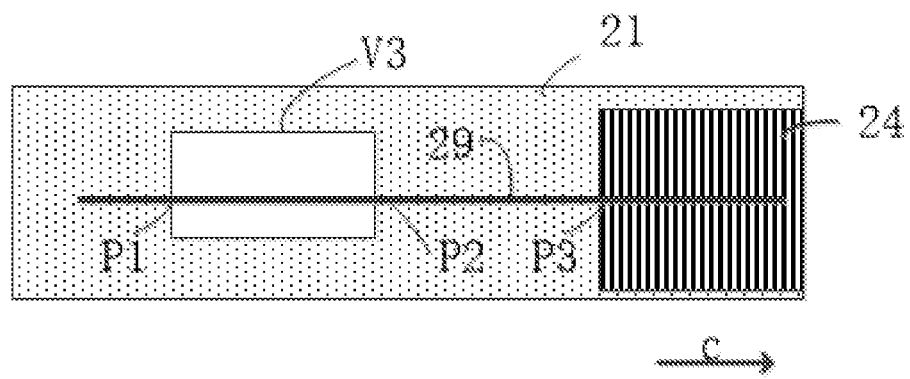
FIG. 6 illustrates a schematic top view of another exemplary array substrate consistent with disclosed embodiments of the present disclosure.
Figure 7:
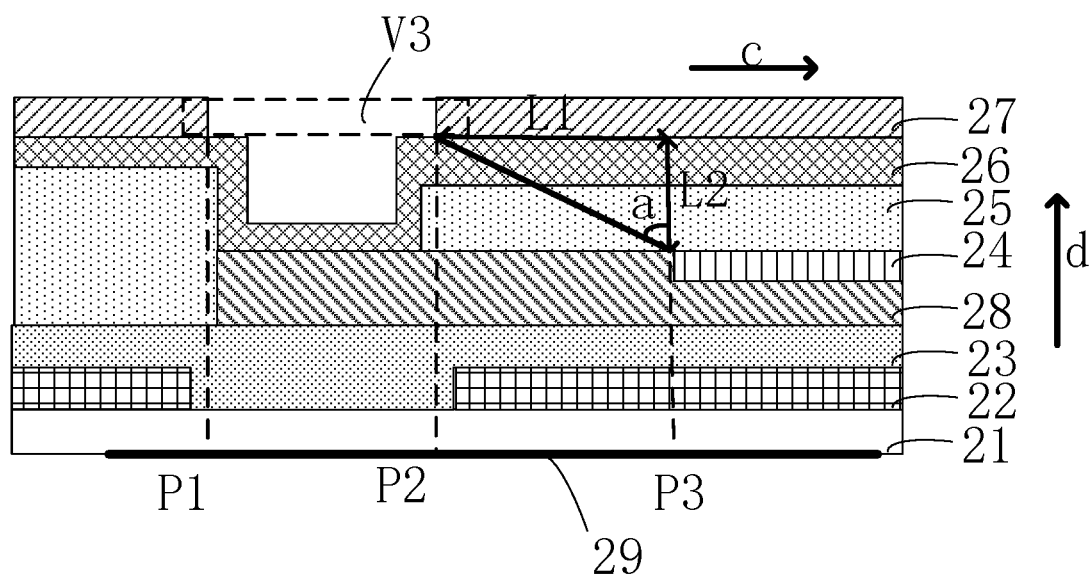
FIG. 7 illustrates a schematic diagram of film layers of another exemplary array substrate consistent with disclosed embodiments of the present disclosure.

FIG. 6 illustrates a schematic top view of an exemplary array substrate consistent with disclosed embodiments of the present disclosure, FIG. 7 illustrates a schematic diagram of film layers of another exemplary array substrate consistent with disclosed embodiments of the present disclosure, and FIG. 6 is a top view of FIG. 7. Further, in certain embodiments, referring to FIG. 6 and FIG. 7, a first straight line 29 extended along a first direction c may have a first intersection P1 and a second intersection P2 with the orthographic projection of the first through-hole V3 onto the base layer 21. The first direction c may be parallel to a plane in which the base layer 21 is located. The orthographic projection of the second metal layer 24 onto the base layer 21 may have a first edge close to the first through-hole V3, and the first straight line 29 may have a third intersection P3 with the first edge. The second intersection P2 may be located between the first intersection P1 and the third intersection P3.

A first distance L1 may be a distance between the second intersection P2 and the third intersection P3. A second distance L2 may be a distance between a side surface of the second metal layer 24 away from the first insulating layer 23 and a side surface of the reflective layer 27 close to the first insulating layer 23 along a second direction d. The second direction d may be perpendicular to the plane in which the base layer 21 is located, and the first distance L1 may be greater than the second distance L2.

In the reflective display panel using the array substrate provided by the present disclosure, the reflective layer 27 having a strong reflection ability, the second metal layer 24 and the first metal layer 22 within a range of the orthographic projection of the through-hole V2 (not illustrated in FIG. 7, referring to FIG. 5) onto the base layer 21 may be removed. At the same time, to enable the pixel electrode disposed on the first electrode layer 26 to be connected to the drain of the thin film transistor disposed on the second metal layer 24, the second electrode layer 28 may be provided.

When the light is irradiated onto the array substrate provided by the present disclosure from the side of the reflective layer 27 away from the first electrode layer 26, the light may be prone to be reflected by the first electrode layer 26, the second electrode layer 28, and the first insulating layer 23 made of a transparent material at the location of the through-hole V2, while the reflectivity may be substantially low, which may reduce the light leakage at the location of the through-hole V2.

Meanwhile, referring to FIG. 7, the first distance L1 may be greater than the second distance L2. In other words, the degree of an angle α may be greater than 45°. Therefore, the angle between the incident light and the second direction d, i.e., the incident angle, may have to be greater than 45° to enable the light to be possibly irradiated onto the second metal layer 24. Further, the incident light may have to pass through the first electrode layer 26 and the second insulating layer 25 before being irradiated onto the second metal layer 24, and may be refracted in view of this. Accordingly, in actual applications, the incident angle may have to be greater than the angle α to enable the light to be possibly irradiated onto the second metal layer 24.

Even if the light is irradiated onto the second metal layer 24 and reflected, most of the reflected light may be hardly emitted out, while may be reflected multiple times between the second metal layer 24 and the reflective layer 27, and, thus, may be gradually absorbed by the material of the array substrate. Even if a small amount of the reflected light is emitted out through the first through-hole V3, because the emission angle is substantially large, the light may be absorbed and scattered by the liquid crystal molecules and the color film substrate in the display panel. Accordingly, the emitted light may be hardly fallen within a viewing angle range. Therefore, even if the light is reflected, the light leakage phenomenon may not occur, and the normal display of the display area may not be affected.

Further, in certain embodiments, referring to FIG. 7, the first distance L1 may be greater than a product of the second distance L2 and 1.73. In other words, the angle α may be greater than 60°. In view of this, the incident angle of the incident light may have to be greater than 60° to enable the light to be possibly irradiated onto the second metal layer 24. Taking into account the refraction of the light at the surface of the first electrode layer 26 or the surface of the second insulating layer 25, on the one hand, the incident light may be hardly irradiated onto the second metal layer 24; and on the other hand, the light reflected by the second metal layer 24 may hardly enter the display angle range of the display panel. In other words, the influence of the reflected light on the display performance may be further reduced, and the display contrast and the display performance may be further improved.

Figure 8:
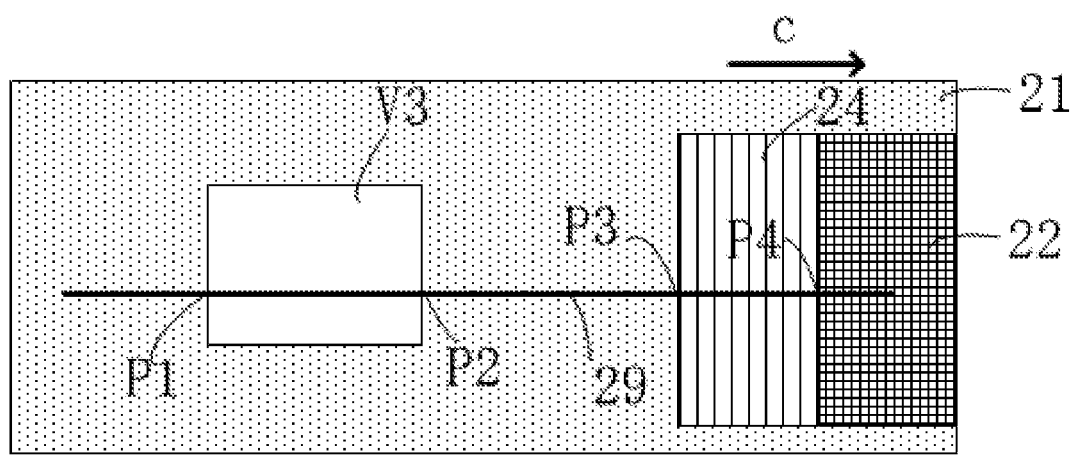
FIG. 8 illustrates a schematic top view of another exemplary array substrate consistent with disclosed embodiments of the present disclosure.
Figure 9:
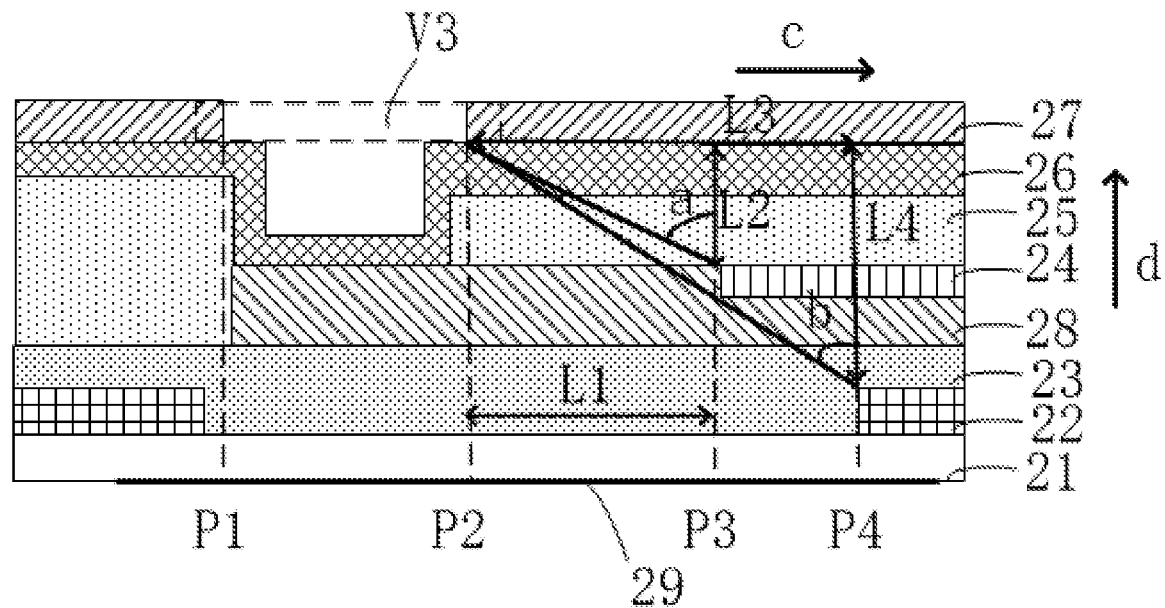
FIG. 9 illustrates a schematic diagram of film layers of another exemplary array substrate consistent with disclosed embodiments of the present disclosure.

FIG. 8 illustrates a schematic top view of an exemplary array substrate consistent with disclosed embodiments of the present disclosure, FIG. 9 illustrates a schematic diagram of film layers of another exemplary array substrate consistent with disclosed embodiments of the present disclosure, and FIG. 8 is a top view of FIG. 9. Further, in certain embodiments, referring to FIG. 8 and FIG. 9, the orthographic projection of the first metal layer 22 onto the base layer 21 may have a second edge close to the first through-hole V3, and the first straight line 29 may have a fourth intersection P4 with the second edge. The second intersection P2 may be located between the first intersection P1 and the fourth intersection P4.

A third distance L3 may be a distance between the second intersection P2 and the fourth intersection P4. A fourth distance L4 may be a distance between the side surface of the first metal layer 22 away from the base layer 21 and the side surface of the reflective layer 27 close to the first insulating layer 23 along the second direction d. The second direction d may be perpendicular to the plane in which the base layer 21 is located. The third distance L3 may be greater than the fourth distance L4, such that the angle b in FIG. 9 may be greater than 45°.

In the reflective display panel using the array substrate provided by the present disclosure, referring to FIG. 9, the first distance L1 may be greater than the second distance L2, such that the angle α may be greater than 45°. In the reflective display panel using the array substrate illustrated in FIG. 9, when the light is irradiated onto the array substrate from the side of the reflective layer 27 away from the first electrode layer 26, the incident angle of the light may have to be greater than 45° to enable the light to be possibly irradiated onto the first metal layer 22 or the second metal layer 24.

In view of this, even if the light is irradiated onto the first metal layer 22 or the second metal layer 24, because the incident angle is substantially large, after being reflected by the first metal layer 22 or the second metal layer 24, the light may be hardly emitted through the first through-hole V3 due to the substantially large reflection angle. Even if a portion of the light is emitted out through the first through-hole V3, the emitted light may be close to an edge of the viewing angle range or out of the viewing angle range of the display panel.

Further, in certain embodiments, the third distance L3 may be greater than the product of the fourth distance L4 and 1.73, and accordingly, the angle b may be greater than 60°, which may further ensure that the incident light is hardly irradiated onto the first metal layer 22, thereby improving the display contrast and the display performance.

Figure 10:
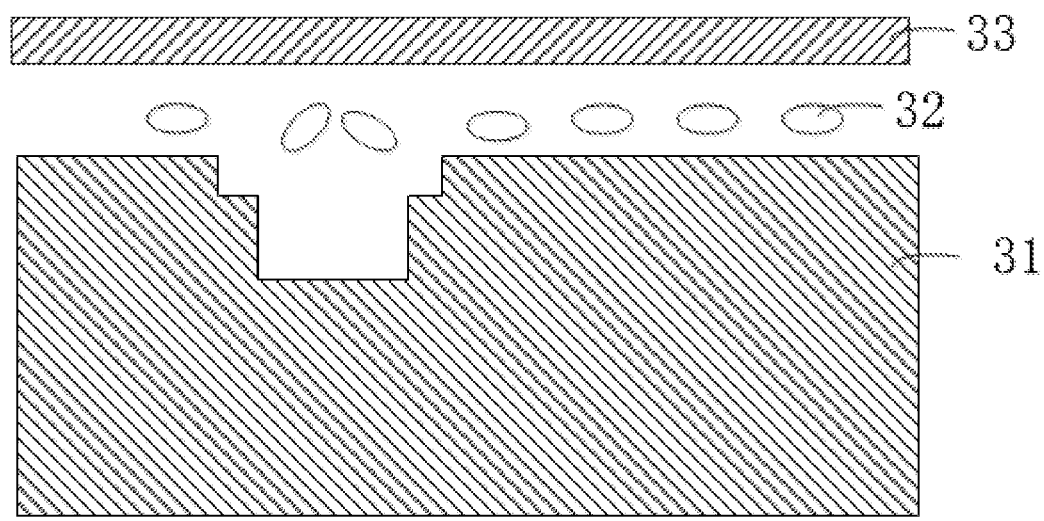
FIG. 10 illustrates a schematic diagram of film layers of an exemplary display panel consistent with disclosed embodiments of the present disclosure.

The present disclosure also provides a display panel. FIG. 10 illustrates a schematic diagram of film layers of an exemplary display panel consistent with disclosed embodiments of the present disclosure. Referring to FIG. 10, the display panel may include any one of the disclosed array substrates 31. In one embodiment, the display panel may also include liquid crystal molecules 32 and a color film substrate 33. The disclosed display panel may be used for a reflective display panel, or a semi-reflective display panel, which may be determined according to various application, and is not limited by the present disclosure.

In the disclosed array substrate and the display panel, the reflective layer having a high reflectivity, the second metal layer and the first metal layer at the location of the through-hole may be removed. Therefore, when the reflective display panel using the array substrate provided by the present disclosure is irradiated by the light source, the light leakage may not occur at the location of the through-hole, and the display contrast and display performance may be improved.

The reflective display panel using the array substrate provided by the present disclosure may eliminate the use of the black matrix for blocking the through-hole, thereby increasing the effective display area of the display panel. The pixel electrode may be connected to the drain of the thin film transistor disposed on the second metal layer through a transparent conductive material at the location of the through-hole, which may reduce the contact resistance.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and features disclosed herein.

What is claimed is:

1. An array substrate, comprising:
   a base layer;
   a first metal layer, disposed on a side of the base layer and used to form a gate of a thin film transistor;
   a first insulating layer, disposed on a side of the first metal layer away from the base layer;
   a second metal layer, disposed on a side of the first insulating layer away from the first metal layer and used to form a source and a drain of the thin film transistor;
   a second insulating layer, disposed on a side of the second metal layer away from the first insulating layer;
   a first electrode layer, disposed on a side of the second insulating layer away from the second metal layer and used to form a pixel electrode;
   a reflective layer, disposed on a side of the first electrode layer away from the second insulating layer and used to realize a reflective display, wherein:
      the second insulating layer is provided with a through-hole,
      the pixel electrode is connected to the drain of the thin film transistor through the through-hole,
      the reflective layer is provided with a first through-hole to expose the first electrode layer, and
      an orthographic projection of the first through-hole onto the base layer covers an orthographic projection of the through-hole onto the base layer; and
   a second electrode layer, disposed between the first electrode layer and the first insulating layer, wherein:
      the first electrode layer and the second electrode layer each is a transparent conductive film,
      a portion of an orthographic projection of the second electrode layer onto the base layer covers the orthographic projection of the through-hole onto the base layer and an orthographic projection of the drain of the thin film transistor onto the base layer, respectively, and
      an orthographic projection of the second metal layer onto the base layer does not overlap with the orthographic projection of the through-hole onto the base layer, such that, without a black matrix, light irradiated on the reflective layer passes through the second through hole, the first electrode layer, and the second electrode layer without substantial reflection and, light irradiated onto the first electrode layer, and irradiated onto the second electrode layer after passing through the first electrode layer, is not directly irradiated onto the second metal layer having the source and drain of the thin film transistor.

2. The array substrate according to claim 1, wherein: the second electrode layer is disposed between the first insulating layer and the second metal layer.

3. The array substrate according to claim 1, wherein: the second electrode layer is disposed between the second metal layer and the second insulating layer.

4. The array substrate according to claim 1, wherein: the first metal layer is further used to form a storage electrode;
a first straight line extended along a first direction has a first intersection and a second intersection with the orthographic projection of the first through-hole onto the base layer, wherein the first direction is parallel to a plane in which the base layer is located;
the orthographic projection of the second metal layer onto the base layer has a first edge close to the first through-hole, and the first straight line has a third intersection with the first edge, wherein the second intersection is located between the first intersection and the third intersection;
a first distance is a distance between the second intersection and the third intersection;
a second distance is a distance between a side surface of the second metal layer away from the first insulating layer and a side surface of the reflective layer close to the first insulating layer along a second direction, wherein the second direction is perpendicular to the plane in which the base layer is located; and
the first distance is greater than the second distance.

5. The array substrate according to claim 4, wherein: the first distance is greater than a product of the second distance and 1.73.

6. The array substrate according to claim 1, wherein: the first metal layer is further used to form a storage electrode;
a first straight line extended along a first direction has a first intersection and a second intersection with the orthographic projection of the first through-hole onto the base layer, wherein the first direction is parallel to a plane in which the base layer is located;
an orthographic projection of the first metal layer onto the base layer has a second edge close to the first through-hole, and the first straight line has a fourth intersection with the second edge, wherein the second intersection is located between the first intersection and the fourth intersection;
a third distance is a distance between the second intersection and the fourth intersection;
a fourth distance is a distance between a side surface of the first metal layer away from the base layer and a side surface of the reflective layer close to the first insulating layer along a second direction, wherein the second direction is perpendicular to the plane in which the base layer is located; and
the third distance is greater than the fourth distance.

7. The array substrate according to claim 6, wherein: the third distance is greater than a product of the fourth distance and 1.73.

8. The array substrate according to claim 1, wherein: the orthographic projection of the first through-hole onto the base layer coincides with the orthographic projection of the through-hole onto the base layer.

9. A display panel, comprising:
an array substrate, wherein the array substrate includes:
a base layer;
a first metal layer, disposed on a side of the base layer and used to form a gate of a thin film transistor;
a first insulating layer, disposed on a side of the first metal layer away from the base layer;
a second metal layer, disposed on a side of the first insulating layer away from the first metal layer and used to form a source and a drain of the thin film transistor;
a second insulating layer, disposed on a side of the second metal layer away from the first insulating layer;
a first electrode layer, disposed on a side of the second insulating layer away from the second metal layer and used to form a pixel electrode; and
a reflective layer, disposed on a side of the first electrode layer away from the second insulating layer and used to realize a reflective display, wherein:
the second insulating layer is provided with a through-hole,
the pixel electrode is connected to the drain of the thin film transistor through the through-hole,
the reflective layer is provided with a first through-hole to expose the first electrode layer, and
an orthographic projection of the first through-hole onto the base layer covers an orthographic projection of the through-hole onto the base layer; and
a second electrode layer, disposed between the first electrode layer and the first insulating layer, wherein:
the first electrode layer and the second electrode layer each is a transparent conductive film,
a portion of an orthographic projection of the second electrode layer onto the base layer covers the orthographic projection of the through-hole onto the base layer and an orthographic projection of the drain of the thin film transistor onto the base layer, respectively, and
an orthographic projection of the second metal layer onto the base layer does not overlap with the orthographic projection of the through-hole onto the base layer, such that, without a black matrix, light irradiated on the reflective layer passes through the second through hole, the first electrode layer, and the second electrode layer without substantial reflection and, light irradiated onto the first electrode layer, and irradiated onto the second electrode layer after passing through the first electrode layer, is not directly irradiated onto the second metal layer having the source and drain of the thin film transistor.

10. The display panel according to claim 9, wherein: the second electrode layer is disposed between the first insulating layer and the second metal layer.

11. The display panel according to claim 9, wherein: the second electrode layer is disposed between the second metal layer and the second insulating layer.

12. The array substrate according to claim 9, wherein: the first metal layer is further used to form a storage electrode;

a first straight line extended along a first direction has a first intersection and a second intersection with the orthographic projection of the first through-hole onto the base layer, wherein the first direction is parallel to a plane in which the base layer is located;

the orthographic projection of the second metal layer onto the base layer has a first edge close to the first through-hole, and the first straight line has a third intersection with the first edge, wherein the second intersection is located between the first intersection and the third intersection;

a first distance is a distance between the second intersection and the third intersection;

a second distance is a distance between a side surface of the second metal layer away from the first insulating layer and a side surface of the reflective layer close to the first insulating layer along a second direction, wherein the second direction is perpendicular to the plane in which the base layer is located; and the first distance is greater than the second distance.

13. The display panel according to claim 12, wherein:
the first distance is greater than a product of the second distance and 1.73.

14. The array substrate according to claim 9, wherein:
the first metal layer is further used to form a storage electrode;

a first straight line extended along a first direction has a first intersection and a second intersection with the orthographic projection of the first through-hole onto the base layer, wherein the first direction is parallel to a plane in which the base layer is located;

an orthographic projection of the first metal layer onto the base layer has a second edge close to the first through-hole, and the first straight line has a fourth intersection with the second edge, wherein the second intersection is located between the first intersection and the fourth intersection;

a third distance is a distance between the second intersection and the fourth intersection;

a fourth distance is a distance between a side surface of the first metal layer away from the base layer and a side surface of the reflective layer close to the first insulating layer along a second direction, wherein the second direction is perpendicular to the plane in which the base layer is located; and the third distance is greater than the fourth distance.

15. The display panel according to claim 14, wherein:
the third distance is greater than a product of the fourth distance and 1.73.

16. The display panel according to claim 9, wherein:
the orthographic projection of the first through-hole onto the base layer coincides with the orthographic projection of the through-hole onto the base layer.

* * * * *